United States Patent
Richey, III

[11] Patent Number: 6,131,651
[45] Date of Patent: Oct. 17, 2000

[54] FLEXIBLE HEAT TRANSFER DEVICE AND METHOD

[75] Inventor: Joseph B. Richey, III, Chesterland, Ohio

[73] Assignee: Advanced Ceramics Corporation, Lakeland, Ohio

[21] Appl. No.: 09/154,253

[22] Filed: Sep. 16, 1998

[51] Int. Cl.[7] ........................ F28F 7/00
[52] U.S. Cl. ............... 165/185; 361/386; 174/16.3; 428/117; 428/320.2
[58] Field of Search ............... 165/80.2, 185, 165/104.33, 46; 174/16.3; 361/386; 428/112, 320.2, 117, 118, 131; 252/511

[56] References Cited

U.S. PATENT DOCUMENTS

| | | | |
|---|---|---|---|
| 640,534 | 1/1900 | Cheney | 165/46 |
| 4,093,755 | 6/1978 | Dahl et al. | 165/133 |
| 4,212,347 | 7/1980 | Eastman | 165/46 |
| 4,234,638 | 11/1980 | Yamazoe et al. | 428/133 |
| 4,752,518 | 6/1988 | Lohrke et al. | 428/131 |
| 4,782,893 | 11/1988 | Thomas | 165/185 |
| 5,141,050 | 8/1992 | Schuft | 165/185 |
| 5,224,030 | 6/1993 | Banks et al. | 165/185 |
| 5,390,734 | 2/1995 | Voorhes et al. | 165/185 |
| 5,566,752 | 10/1996 | Arnold et al. | |
| 5,695,847 | 12/1997 | Browne | 428/112 |
| 5,863,467 | 1/1999 | Mariner et al. | 252/511 |
| 5,876,831 | 3/1999 | Rawal | 428/117 |
| 5,958,572 | 9/1999 | Schmidt et al. | 428/320.2 |

FOREIGN PATENT DOCUMENTS

| | | |
|---|---|---|
| 0 528 606 | 2/1993 | European Pat. Off. . |
| 0 651 603 | 3/1995 | European Pat. Off. . |
| 197 04 549 | 8/1997 | Germany . |

OTHER PUBLICATIONS

"Thermal flex connector" IBM Technical Disclosure Bulletin., vol. 20, No. 2, Jul. 1997, p. 682, XP002086037, New York, US.

*Primary Examiner*—Ira S. Lazarus
*Assistant Examiner*—Terrell McKinnon
*Attorney, Agent, or Firm*—Anderson, Kill & Olick P.C.

[57] ABSTRACT

A thin flexible heat transfer device for transferring heat from a heat source to a heat sink which may be located a substantial distance apart from each other. The heat transfer device includes a thin sheet of a non-structural, high thermal conductivity core material consisting of pyrolytic graphite or highly ordered pyrolytic graphite of a thickness between 2 microns and 2 mm and a pair of flexible face sheets each of a metallic composition having a maximum thickness of less than 25 mils disposed upon opposing surfaces of said core material to form a sandwich construction in cross section with the sheet of core material having a width smaller than the width of said face sheets such that the face sheets overlap the width of said core material around the perimeter of the device for enclosing and sealing the core material therewithin.

9 Claims, 2 Drawing Sheets

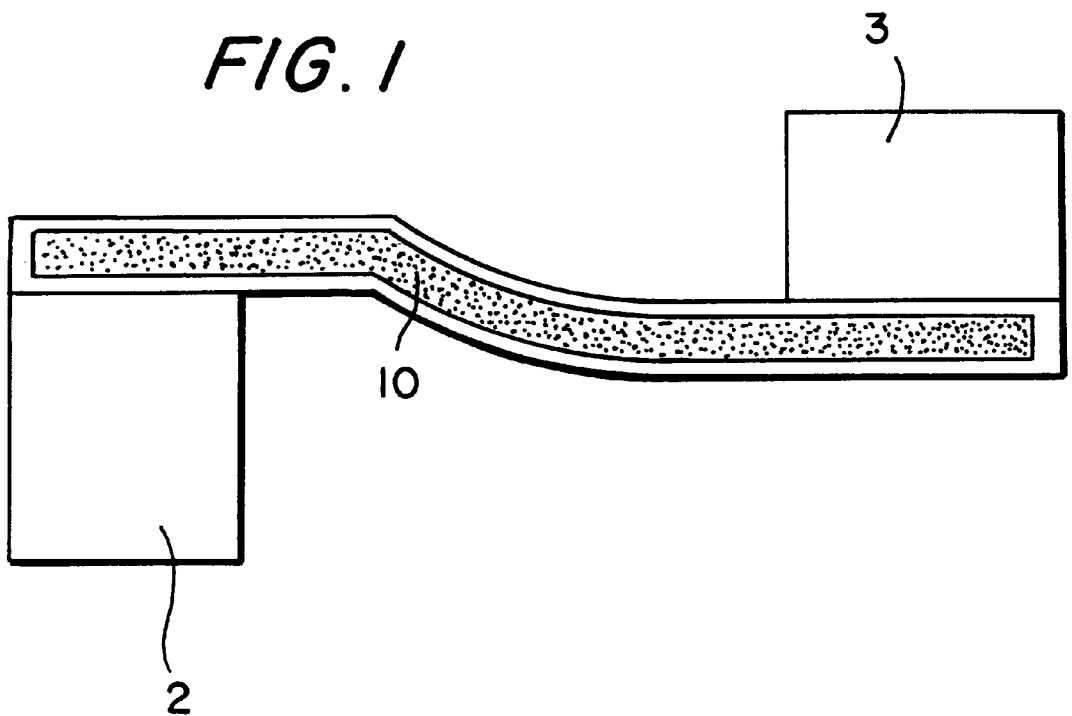

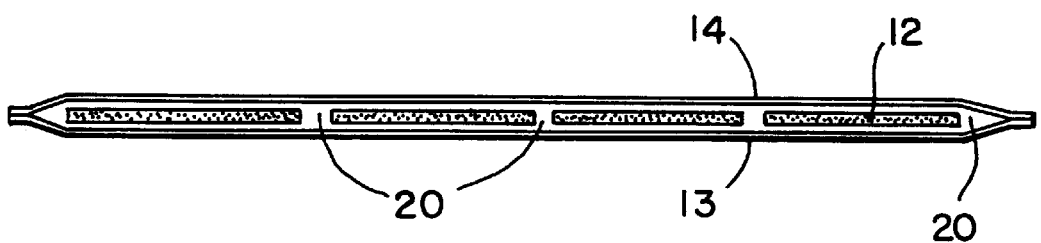
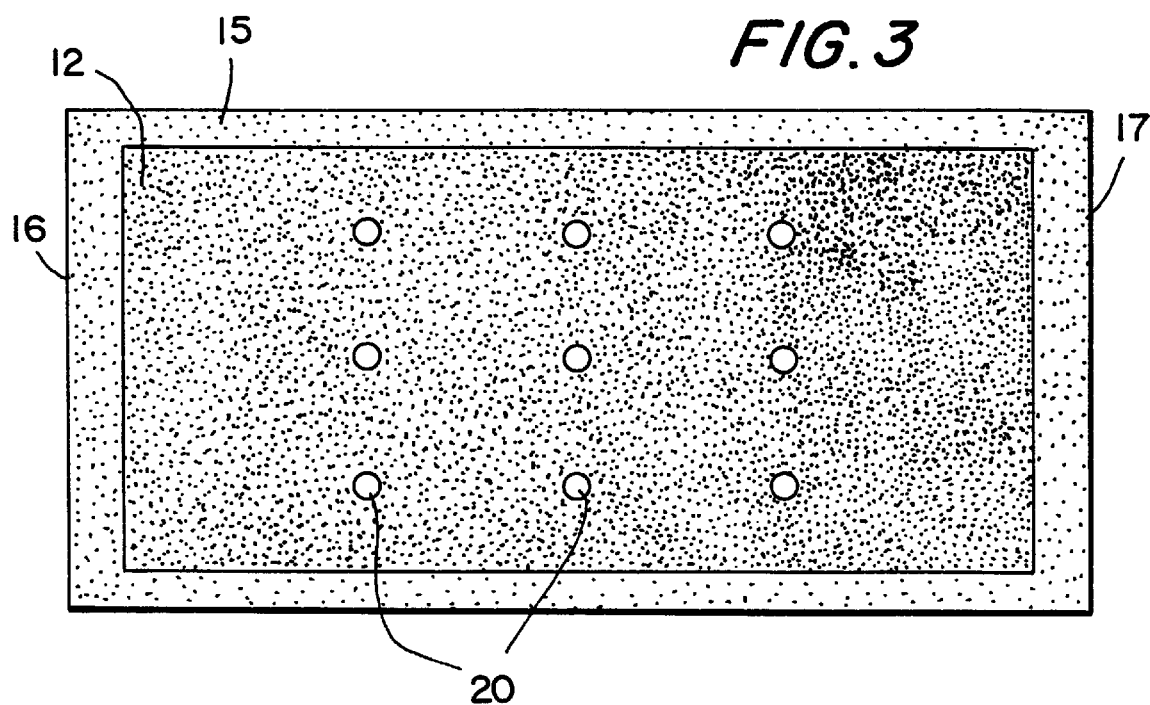

FLEXIBLE HEAT TRANSFER DEVICE AND METHOD

FIELD OF THE INVENTION

This invention relates to a flexible heat transfer device and to a method of manufacture.

BACKGROUND OF THE INVENTION

Many forms of thermal management exist today all of which depend upon the principles of conduction, convection or radiation to move heat. Good thermal conductivity is required to permit heat transfer away from high density electronic components and devices such as integrated circuits. High thermal conductivity materials are conventionally used in heat transfer devices to dissipate heat from semiconductor circuits and systems. Elemental metals are not satisfactory for the semiconductor circuit systems in use today. This has led to the use of high conductivity heat transfer devices formed from composites or laminations of different materials fabricated into various structural assemblies which will possess the desired high thermal conductivity, strength and other needed properties.

The heat transfer device is physically connected between a heat source, which generates considerable waste heat, and a heat sink. However in many cases the heat source and heat sink are not in close proximity and one or both may not be easily accessed for interconnecting a heat transfer device. In these situations the heat transfer device needs to be malleable and flexible. Currently available heat transfer devices which have very high thermal conductivities relative to the thermal conductivity of elemental metals are not readily usable in these situations.

This invention also addresses the issues of cost to remove heat in space constrained areas where thermal management by conduction requires a material that can be easily configured to provide a low-density, flexible, thin cross-section for the movement and redistribution of heat loads from heat sensitive electronic components or systems to areas where heat may be dissipated.

SUMMARY OF THE INVENTION

The preferred embodiment of the present invention relates to a highly flexible heat transfer device for thermal management applications where physical space and/or accessibility between the heat source and heat sink is a factor. The heat transfer device of the present invention comprises a high thermal conductivity core material composed of graphite preferably in the form of a flat plate or strip which is sandwiched between two thin and preferably flexible metal face sheets to enclose the core material between its opposing surfaces. The two metal face sheets are preferably bonded together to form a unitary heat transfer device. The bonding agent is preferably an adhesive. The geometry of each metal face sheet is larger than that of the core material to form an overlap on each side thereof. In the preferred assembly one of the face sheets is disposed on one side of the core strip with the other face sheet disposed on the opposite side of the core strip so that they overlap to fully enclose the core strip with the face sheets being bonded together by an adhesive.

BRIEF DESCRIPTION OF THE DRAWINGS

FIG. 1 shows a cross sectional view of the flexible heat transfer device of the present invention shown connected in position between a heat source and a heat sink;

FIG. 2 shows a cross sectional view of another embodiment of the flexible heat transfer device of the present invention; and FIG. 3 shows a top view of the embodiment of FIG. 2 with the top face sheet removed so as to expose the strip core material, via holes, underlayer face metal and the bonding agent around the exposed border of the underlayer.

BRIEF DESCRIPTION OF THE PREFERRED EMBODIMENT

With reference to FIGS. 1–3 the heat transfer device 10 preferably consists of a non-structural high thermal conductivity core material in the form of a strip 12 which is sealed or bonded between two opposing face sheets 13 and 14 preferably in the form of foil strips. The face sheets 13 and 14 are bonded together preferably using a bonding agent 15 such as an adhesive. Alternatively, sealing can be accomplished without an adhesive by forming a diffusion bond by application of sufficient pressure and/or temperature between the face sheets 13 and 14. The face sheets 13 and 14 should be sealed by bonding at least around the perimeter of the core material 12.

The non-structural high thermal conductivity core material 12 may be selected from any material having a high thermal conductivity including pyrolytic graphite, compression annealed pyrolytic graphite, thermal pyrolytic graphite, highly ordered pyrolytic graphite, synthetic diamond, highly ordered boron nitride, compression annealed boron nitride, thermal pyrolytic graphite, pyrolytic graphite, hexagonal boron nitride and cubic boron nitride. The in-plane thermal conductivity of the high thermal conductivity core material 12 should be greater than 200 W/mK and preferably greater than 500 W/mk for each of the pyrolytic graphite core materials and synthetic diamond.

The bonding agent 15 may be selected from any conventional organic adhesive composition preferably of an acrylic or thermosetting epoxy compound or any thermoplastic strong enough to secure the core strip 12. Alternatively, the bonding agent may be a metal based material such as a solder, brazing alloy or may be represented by eutectic mixtures of two or more metals.

The face or foil strips 13 and 14 are preferably rectangular in geometry (although not limited thereto) and composed from sheet metal of preferably high conductivity such as aluminum, copper, silver, gold, nickel, beryllium, tin, lead and steel or an alloy thereof or a composite such as Kovar, copper-tungsten, copper-molybdenum, Invar, aluminum-beryllium and tin-lead. Alternatively, the foil strips 13 and 14 may be formed of organic material i.e. a plastic, Mylar, kapton, polyamide or a paralyne or may be composed of a polymer composite such as glass fiber organic composites, carbon fiber organic composites or Kelvar fiber organic composites. For flexibility the foil strips 13 and 14 should be thin relative to the thickness of the core material 12 with each of the face sheets having a thickness of between about 2 microns and 2 millimeters and preferably having a maximum thickness in the order of 10–25 mils. The volume fraction ratio of core material 12 to the face sheets including the bonding agent 15 if applied should be between about 5 and 95%. The foil strips 13 and 14 should be somewhat larger in size relative to the core strip 12 both in width and length so that an overlap exists as shown in FIG. 3 which facilitates fully enclosing the core strip 12. The bonding adhesive 15 can be coated over the entire inside facial surface of each metal foil strips 13 and 14 on each of the adjacent sides 16 and 17 so that the adhesive material 12 will not permit any air gap or voids between the core strip 12 and the foil strips 13 and 14. Alternatively, the metal foils may be coated only around the overlapping perimeters which extend from the coil strip 12. The bonding adhesive laminates the foil metal strips together upon assembly to form an integrated structure with the pyrolytic graphite core strip 12 fully enclosed and supported by the metal foils strips 13 and 14.

The core strip 12 provides the primary or sole thermal path for the movement of heat. The face sheets 13 and 14 provide protection for the core strip and act as a barrier insuring that the core material 12 will not release damaging particles or gasses to the environment. The face sheets 12 and 13 also increase the ease of handling of the heat transfer device 10 independent of the core material composition 12 such that very high thermal conductivity core materials can be used in applications where space is at a premium.

The preferred core material 12 is pyrolytic graphite and more particularly an annealed pyrolytic graphite known to those skilled in the art as thermal pyrolytic graphite "TPG" or alternatively a compressed annealed pyrolytic graphite "CAPG". These different graphite materials are commercially manufactured and available from Advanced Ceramics Corporation in Cleveland Ohio. Conventional high conductivity graphite reinforced composites have in-plane thermal conductivity on the order of 300 W/m-k. CAPG and TPG can provide conductivities well over 1500 W/m-k.

The flexibility of the core strip 12 is dependent on how thin it is. The thickness of the core strip 12 can vary from 1 angstrom to ¼" thick but preferably has a thickness of between about 2 microns and 2 millimeters.

The face sheets 13 and 14 and core 12 may be integrally formed by depositing the face sheets 13 and 14 over opposite surfaces of the core 12 to form the opposing surfaces of the heat transfer device 10 using any known conventional coating process such as chemical vapor deposition, physical vapor deposition, plasma vapor deposition, electroplating, electroless plating, dipping and spraying. The assembly can be finished following the coating operation by trimming or cutting excess material to produce the final form. Alternatively, strips of face sheets 13 and 14 can be superimposed on the opposite sides of the core 12 with the sheets 13 and 14 bonded under pressure and/or temperature to form a diffusion bond between the face sheets 13 and 14 and preferably the periphery of the core material 12. The same finishing operation of trimming or cutting may be used to form the final form.

When an adhesive is employed it may be applied by painting, spraying or dipping the adhesive onto the opposing inside surfaces of the face sheets 12 and 13.

In FIG. 1 the assembled heat transfer device 10 is shown physically connected between a heat source 2 and a heat sink 3 which can be separated by a substantial distance and in areas not easily accessible. The heat transfer device 10 is easily bent and shaped to be connected by any conventional means using a clamp or bolt or by welding or soldering for affixing the heat transfer device 10 to the respective heat source 2 and heat sink 3.

The interface between the metal face sheets 12 and 14 and the core material 12 allows for physical contact through the bonding agent. In the embodiment of FIGS. 2 and 3 via holes 20 are shown spaced apart throughout the core material to provide a structural path between the opposing face sheets. The incorporation of via holes 20 is very important since they minimize the tendency of the laminated heat transfer assembly 10 to delaminate. In addition when no adhesive is used the pair of flexible face sheets whether of metal or of organic composition may be bonded under pressure and/or temperature to form an integrated heat transfer body with the face sheets 12 and 13 forming a diffusion bond between the face sheets at the perimeter edge of the core 12 and at the via hole locations. The via holes 20 can be filled, if desired, with a material corresponding to the composition of the face sheets or any other desired material composition to provide a solid volume which provides structural support. In addition, the filled via holes 20 can be used to support threaded fasteners and/or alignment pins.

What is claimed is:

1. A thin flexible heat transfer device of indefinite length for transferring heat from a heat source to a heat sink which may be located a substantial distance apart from one another comprising:

a thin sheet of a non-structural, high thermal conductivity core material consisting of pyrolytic graphite or highly ordered pyrolytic graphite having an in-plane thermal conductivity of greater than 200 W/mK and a thickness of between 2 microns and 2 mm;

a pair of flexible face sheets each of a metallic composition having a maximum thickness of less than 25 mils disposed upon opposing surfaces of said core material to form a sandwich construction in cross section with the sheet of core material having a width smaller than the width of said face sheets such that the face sheets overlap the width of said core material and with said face sheets being bonded to one another at least around the perimeter of said device for enclosing and sealing said core material there within.

2. A heat transfer device as defined in claim 1 further comprising via holes in said core material.

3. A heat transfer device as defined in claim 2 wherein said face sheets are bonded by means of an adhesive agent selected from the group consisting of an organic adhesive, an inorganic adhesive, a solder, a brazing alloy and eutectic mixtures of two or more metals.

4. A heat transfer device as defined in claim 3 wherein said via holes are filled with said bonding agent.

5. A heat transfer device as defined in claim 4 wherein said bonding agent is of a thickness between 0.5 and 1 millimeter.

6. A heat transfer device as defined in claim 5 wherein the volume ratio of core material to face sheet plus bonding agent is between about 5 and 95%.

7. A heat transfer device as defined in claim 2 wherein the metallic composition of each face sheet is selected from the group consisting of aluminum, copper, silver, gold, nickel, beryllium, tin, lead, steel, Kovar, copper-tungsten composites, copper-molybdenum composites and tin-lead composites.

8. A heat transfer device as defined in claim 7 wherein the in-plane thermal conductivity of the core material is greater than 200 W/mK.

9. A heat transfer device as defined in claim 4 wherein said bonding agent is an organic adhesive selected from the group consisting of thermoset, acrylics and thermoplastics.

* * * * *